(12) United States Patent
Pullmann et al.

(10) Patent No.: US 6,628,015 B2
(45) Date of Patent: Sep. 30, 2003

(54) SAFETY SWITCHING DEVICE AND SYSTEM OF SAFETY SWITCHING DEVICES

(75) Inventors: Jürgen Pullmann, Ebersbach (DE); Richard Veil, Stuttgart (DE)

(73) Assignee: Pilz GmbH & Co., Ostfildern (DE)

( * ) Notice: Subject to any disclaimer, the term of this patent is extended or adjusted under 35 U.S.C. 154(b) by 0 days.

(21) Appl. No.: 10/235,317

(22) Filed: Sep. 5, 2002

(65) Prior Publication Data

US 2003/0011250 A1 Jan. 16, 2003

Related U.S. Application Data

(63) Continuation of application No. PCT/EP01/02561, filed on Mar. 6, 2001.

(30) Foreign Application Priority Data

Mar. 8, 2000 (DE) .......................................... 100 11 211

(51) Int. Cl.[7] .............................................. H01H 9/26
(52) U.S. Cl. ...................................................... 307/326
(58) Field of Search ................................ 307/326–328; 361/191–193

(56) References Cited

U.S. PATENT DOCUMENTS

| 4,360,807 | A | * | 11/1982 | Zettergren | 361/193 |
| 5,233,231 | A | * | 8/1993 | Wieth et al. | 307/328 |
| 5,235,217 | A | * | 8/1993 | Kirton | 307/326 |
| 5,825,102 | A | * | 10/1998 | Babiel et al. | 307/326 |
| 5,949,273 | A | | 9/1999 | Mourick et al. | |
| 5,999,395 | A | * | 12/1999 | Klees | 307/326 |
| 6,060,796 | A | * | 5/2000 | Schmitz et al. | 307/326 |
| 6,392,318 | B1 | * | 5/2002 | Griffis | 307/326 |

FOREIGN PATENT DOCUMENTS

| DE | 21 09 202 | | 9/1972 |
| DE | 44 24 285 | A1 | 1/1996 |
| DE | 196 26 129 | A1 | 1/1998 |
| DE | 196 28 131 | A1 | 1/1998 |
| DE | 197 36 183 | C1 | 4/1999 |

OTHER PUBLICATIONS

Fevrier 1967, "DIGITHOM II relayage statique de sécurité", 4–pages.
Eduard Strang, "Überwachungsbausteine für fehlersichere Signalverarbeitung" 3–pages.
Dr. –Ing. Klaus Meyer. "Sicherheitssysteme für elektronisch gesteuerte Anlagen", 6–pages.

* cited by examiner

*Primary Examiner*—Gregory J. Toatley, Jr.
(74) *Attorney, Agent, or Firm*—Harness, Dickey & Pierce, P.L.C.

(57) ABSTRACT

The invention relates to a safety switching device for connecting and safely disconnecting an electrical load, in particular an electrically driven machine. The safety switching device comprises at least a first and a second electronic switching element, at least a first and a second output terminal, and at least one input terminal for a first switching signal that acts on the switching elements. According to one aspect of the invention, the first and the second switching element each have an output which, depending on the first switching signal, produces an output signal at a first potential or at a second potential. The output of the first switching element is connected to the first output terminal, and the output of the second switching element is connected to the second output terminal. The invention further relates to a system of safety switching devices of this kind.

13 Claims, 5 Drawing Sheets

SAFETY SWITCHING DEVICE AND SYSTEM OF SAFETY SWITCHING DEVICES

CROSS-REFERENCES TO RELATED APPLICATIONS

This application is a continuation of copending international patent application PCT/EP01/02561 filed on Mar. 6, 2001 and designating the U.S., which was not published under PCT Article 21(2) in English, and which claims priority of German patent application DE 100 11 211.0 filed on Mar. 8, 2000.

BACKGROUND OF THE INVENTION

The present invention relates to a safety switching device for connecting and safely disconnecting an electrical load, in particular an electrically driven machine. The safety switching device has at least a first and a second electronic switching element, at least a first and a second output terminal, and at least one input terminal for a first switching signal, which acts on the switching elements.

The invention further relates to a system of safety switching devices having at least two of the above-mentioned safety switching devices.

Safety switching devices of this generic type are primarily used in the industrial sector, in order to connect and, especially, in order to safely disconnect electrically driven machines, such as a brake press or a milling tool. They are particularly used in conjunction with mechanically operated emergency-off buttons to disconnect the machine quickly and reliably in an emergency situation. For this purpose, the power supply for the machine which is to be disconnected is generally passed via make contacts of two relays or contactors acting as switching elements. The switching elements are driven by the safety switching device in a fail-safe manner. As soon as any one of the two switching elements opens its make contacts, the power supply to the machine is interrupted.

Safety switching devices of this type require special approval in many countries since they are used in safety-critical areas. The intrinsic fail-safety of the devices is tested in this process. For the purposes of the present invention, safety switching devices are thus only those which are suitable, by virtue of an appropriate approval, for safety-critical use, in particular those which comply with safety category 3 or higher as defined in European Standard EN 954-1. Furthermore, the term safety switching devices should be distinguished here from so-called safety programmable logic controllers. The former comprise a functionality which is permanently implemented by the manufacturer, for example as a protective guard monitoring device or a two-channel emergency-off switching device. Devices such as these can be configured within predetermined limits in some cases, but their basic function is predetermined and thus, in contrast to a safety programmable logic controller, is not freely programmable by the user.

Figure 1:
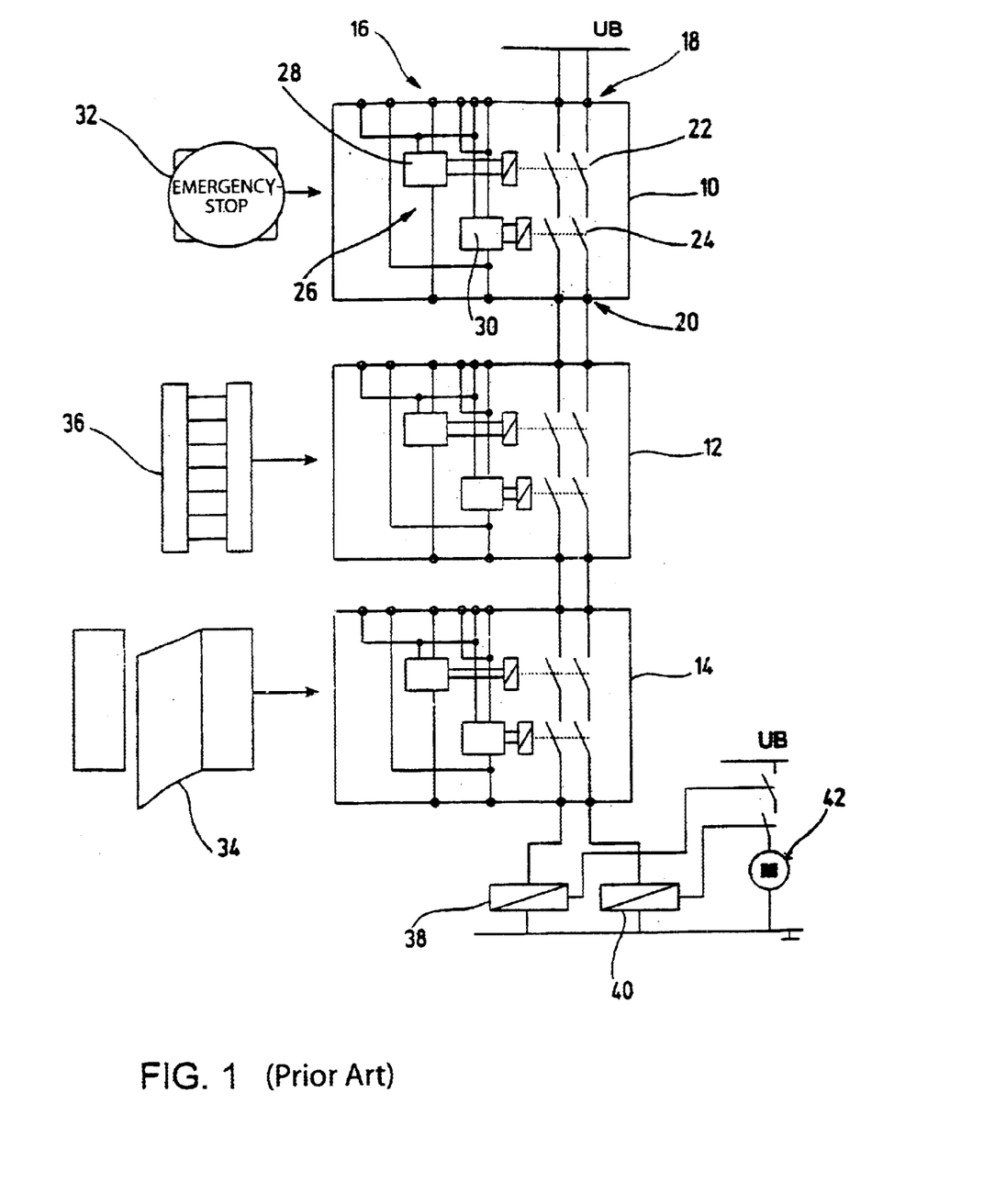
FIG. 1 shows a schematic illustration of a system of safety switching devices according to the prior art.

Safety switching devices, which have been proven in practice, are largely of an electromechanical kind, i.e. said switching elements are based on relays or contactors. One example of such kind of a safety switching device is known from DE 197 36 183 C1. In order to illustrate a usual application of these conventional switching devices, FIG. 1 shows three known safety switching devices, which are denoted by reference symbols 10, 12, 14.

Each safety switching device 10, 12, 14 is a compact, autonomous device with a predetermined functionality. It is accommodated in an enclosure, which is not shown explicitly here but which accommodates the electrical and electromechanical components. The input-side switching signals are fed in via input terminals 16, and output signals are emitted via output terminals 18, 20 which are arranged on the outside of the enclosure, such that they are accessible. A characteristic feature of these conventional safety switching devices is that they each have at least two output terminals 18, 20, which form an output terminal pair. Between each pair of output terminals the make contacts 22, 24 of the electromechanical switching elements are arranged.

In the interior, each safety switching device 10, 12, 14 has a fail-safe evaluation and control unit 26, which evaluates an input-side switching signal in a fail-safe manner, and drives the make contacts 22, 24 accordingly. Depending on the design variant and the required safety category, the evaluation unit 26 is designed as a single-channel or a multi-channel unit. In FIG. 1, each evaluation unit 26 has two evaluation channels 28, 30. During normal operation, the make contacts 22, 24 of the safety switching devices are closed, so that a continuous connection is produced between the output terminals 18 and 20. If the two evaluation channels 28, 30 identify an input-side switching signal, the make contacts 22, 24 are opened, so that the connection between the output terminals 18 and 20 is interrupted. This interruption results in a corresponding machine being stopped.

In practice, a number of switching events, for example the operation of an emergency-off switch 32, the opening of a protective guard 34 or the penetration of a light barrier 36, have to be AND-interconnected. To achieve this, as shown in FIG. 1, the make contacts 22, 24 of a number of safety switching devices 10, 12, 14 are arranged in series. The last safety switching device 14 of the series is usually connected to external contactors 38, 40, which connect or disconnect the power supply to the machine 42. During normal operation, all the make contacts 22, 24 are closed. The contactors 38, 40 are thus live, and the power supply is connected. As soon as one of the above-mentioned switching events is identified by the corresponding safety switching device 10, 12, 14, the associated make contacts 22, 24 are opened. In consequence, the contactors 38, 40 trip, and the power supply to the machine 42 is interrupted.

DE 196 26 129 A1 describes another type of safety switching device in which the electromechanical switching elements are replaced by so-called MOSFETs, i.e. electronic switching elements. Electronic switching elements operate without mechanical contacts and are thus not subject to mechanical wear. Furthermore, they are less expensive than relays today, and they require less space. However, despite these advantages, there is a desire for further improvements.

SUMMARY OF THE INVENTION

It is an object of the present invention to specify a low-cost safety switching device of the above-mentioned kind which can be used in a flexible manner.

It is another object of the invention to specify a safety switching device that can be combined with similar devices to form a system of safety switching devices in an easy and cost-effective manner.

It is another object of the invention to specify a system of safety switching devices that easily allows to implement a hierarchical control structure for an installation having several areas to be switched off.

According to one aspect of the invention, this object is achieved in that the first and the second switching element each have an output which provides an output signal at a first potential or at a second potential depending on the first switching signal, with the output of the first switching element being connected to the first output terminal, and the output of the second switching element being connected to the second output terminal.

The new safety switching device has electronic switching elements and thus, in comparison to conventional safety switching devices with contacts, is highly cost-effective and is subject to little wear. In contrast to the safety switching device mentioned before, however, the switching elements used here generate an active output signal with either a high-level or a low-level output value. This output signal can be processed directly in downstream safety switching devices as an input signal.

An advantage is that the number of output terminals required can be reduced for the same number of switching elements since, instead of an output terminal pair, only a single output terminal is required. This saves physical space and costs for the mechanical connecting terminals.

Furthermore, the new safety switching device is very flexible. Specifically, a number of safety switching devices can be connected in series in order to form a logic interconnection. In this case, the output terminals of an upstream safety switching device are connected to the input terminals of a downstream safety switching device to form a system of safety switching devices. In contrast, until now it has only been possible to connect the respective output terminal pairs in series, without any capability to include the input terminals in the interconnection as well. The new circuitry extends the wide range of applications and makes it possible to construct intelligent, hierarchical safety control systems in a simple manner. A further advantage is the capability to connect the safety switching devices in series without any need for complex and expensive components, such as transformers, optocouplers, etc., for driving the switching elements.

Finally, a further advantage is the considerably shorter switching delay times, which is actually of major importance when a number of safety switching devices are connected in series. This is because the switching delay times are cumulative in a series circuit such as this, so that the maximum permissible values have until now been reached with only a small number of devices. A number of safety switching devices according to the invention can now be connected in series, without reaching the switching delay time of a single conventional safety switching device.

In a refinement of the invention, each switching element comprises a series circuit formed by a transistor and at least one resistor, with the series circuit being fed from a supply voltage for the safety switching device such that the output of the switching element can be switched between the two potentials of the supply voltage.

This embodiment of the switching element has been found to be particularly advantageous in practice. In particular, this allows active output signals which are suitable for driving an external actuator to be produced in a simple and direct manner.

In a further refinement of the invention, the safety switching device comprises a logic interconnection unit and at least one further input terminal for supplying at least one further switching signal, with the logic interconnection unit logically interconnecting the at least one further switching signal and the first switching signal to form a combined switching signal.

The logic interconnection is preferably an AND operation. However, it may also be an OR operation, in order to combine, for example, a confirmation button and a protective guard monitor in a simple manner.

This measure has the advantage that the safety switching device is particularly suitable for arrangement in a series circuit, since the output signal from an upstream safety switching device can be combined very easily and in a fail-safe manner with a separate input-side switching signal of the downstream safety switching device. The options for use of the safety switching device can thus be considerably increased. In particular, a flexible, hierarchical safety control system can be formed in a very simple manner. In this case, different actuators, for example external contactors, are driven by different ones of the interconnected safety switching devices. The initiation of a switching event in one safety switching device in the series then results in a corresponding switching event in all the downstream safety switching devices, but not necessarily in the upstream safety switching devices. A hierarchical safety switching device system such as this is particularly advantageous when the disconnection of a specific machine section is intended to lead to disconnection of downstream machine sections, but not upstream machine sections. By way of example, in the case of a hydraulic press, the initiation of a "right at the front" switching signal allows all the pumps and valves to be switched off while a "at the end of the series" switching signal switches off only a quite specific valve, while the pumps and other valves remain switched on.

The provision of two additional, specific (dedicated) inputs in this case has the advantage that the safety switching device system can be constructed very easily in accordance with the most stringent safety category 4 in European Standard EN 954-1. The switching signals associated directly with the safety switching device can first of all be checked for a cross-connection in the connecting lines, before they are interconnected with the output signal of the upstream safety switching device.

In a further refinement, the safety switching device comprises an mode selector, which allows to choose between at least a first and a second operating mode, with the switching elements supplying steady-state output signals in the first operating mode, and supplying pulsed output signals in the second operating mode.

"Essentially steady-state output signals" are in this case those which appear to be steady-state to a downstream safety switching device of the same type. This does not preclude a situation in which the output signals may nevertheless include signal changes but which are then so short or minor that the downstream safety switching device cannot identify them. Pulsed output signals, on the other hand, may be identified as such and evaluated specifically. This measure makes it possible in a simple way to detect a cross-connection in the connection between two safety switching devices. This allows to comply very easily with the (most stringent) safety category 4 in European Standard EN 954-1 even with interconnected devices.

In a further refinement, the safety switching device has at least two further output terminals and a clock generator, which produces two different clock signals at the two further output terminals.

This measure allows passive signal transmitters, such as emergency-off switches with contacts, to be evaluated very easily in a fail-safe manner, in particular if the signal transmitter is operated only very rarely during operation.

In a further refinement, the safety switching device has a cross-connection monitoring member for the first and second output terminals, wherein the cross-connection monitoring member can be disabled.

This measure allows the output terminals to be connected together in a manner which will be explained in the following text, in order to achieve an increase in current in this way. It is thus possible, for example, to directly drive and to supply a PLC card.

In a further refinement, the safety switching device has at least a first and a second complementary switching element, whose outputs are respectively connected to complementary output terminals of the switching device.

This allows complementary and thus redundant disconnection paths to be set up in a simple way in a safety-critical application, thus further improving the fail-safety overall.

It goes without saying that the features mentioned above as well as the features which are still to be explained in the following text can be used not only in the respectively stated combination but also in other combinations or on their own, without departing from the scope of the present invention.

BRIEF DESCRIPTION OF THE DRAWINGS

Exemplary embodiments of the invention are illustrated in the drawing, and will be explained in more detail in the following description. In the figures.

DETAILED DESCRIPTION OF PREFERRED EMBODIMENTS

Figure 2:
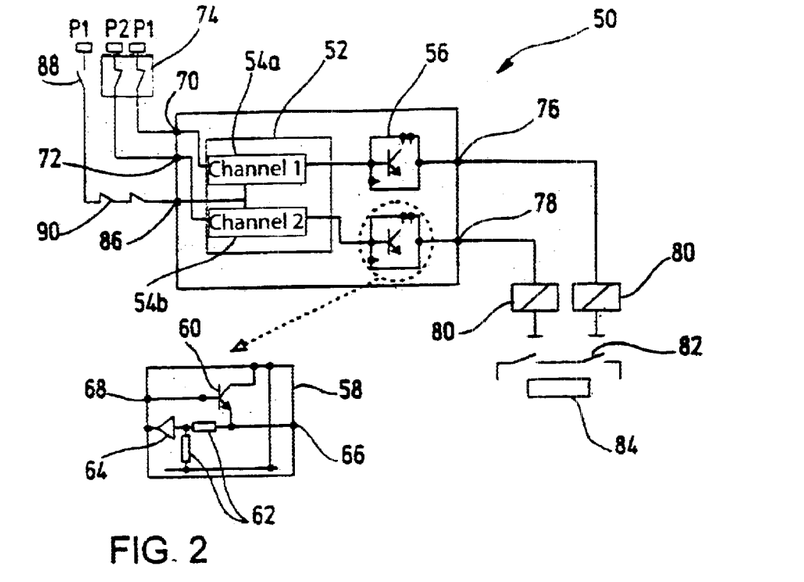
FIG. 2 shows a schematic illustration of a safety switching device according to the invention.

In FIG. 2, a safety switching device according to the invention is generally denoted by reference symbol 50. The safety switching device 50 has a fail-safe evaluation and control unit 52, which is indicated only schematically here for sake of simplicity. The evaluation and control unit 52 is formed from components which are known to those skilled in the art, such as those which are used in the safety switching devices of the "PNOZ" type distributed by the present applicant. The job of the evaluation and control unit 52 is to evaluate switching signals which are supplied on the input side, in a fail-safe-manner, and to effect corresponding output signals.

In the illustrated exemplary embodiment, the evaluation and control unit 52 has two channels, with the two channels being identified by the reference symbols 54a and 54b. However, other configurations of the evaluation and control unit 52 are also possible. For a more detailed explanation, reference is made, by way of example, to the German book "Maschinensicherheit" [Machine safety], by Winfried Gräf, published by Hüthig Verlag, 1997, which is incorporated by reference here.

The safety switching device 50 has switching elements 56, 58, which receive control signals from the evaluation and control unit 52. In a simple case, the switching elements 56, 58 are each in the form of a transistor, whose base receives the control signal and whose emitter or collector signals are an tapped off as output signal; in this case the output signal can be switched between two different potentials, namely a low-level value and a high-level value, by the switching element.

In the present exemplary embodiment, the switching elements 56, 58 each have two series-connected resistors 62 as well as an amplifier 64 in addition to a transistor 60. The collector of the transistor 60 is connected to a first reference potential UB, while the emitter of the transistor 60 is connected to a second potential (ground) via the series-connected resistors 62. The input side of the amplifier 64 is connected to the node between the two resistors 62, and produces a feedback signal at its output.

The output signal from each switching element 56, 58 is tapped off at the emitter of the transistor 60, and is available at an output 66. The output signal from the evaluation and control unit 52 is furthermore passed via an input 68 to the base of the transistor 60.

Each switching element 56, 58 is designed such that the signal produced at the output 66 is switched between the first potential and the second potential depending on the signal at the input 68. In the present exemplary embodiment, the first potential UB is produced at the output 66 when the input signal at the input 68 is at approximately the same potential. If the input signal is close to the second potential, the output signal at the output 66 is also at the second potential.

The safety switching device 50 shown in FIG. 2 has two input terminals 70, 72, which are each connected to the evaluation and control unit 52. In the present exemplary embodiment, a two-channel switch 74 acting as a switching source is connected to these two input terminals 70, 72, namely such that the input terminal 70 is connected to a potential P1 and the input terminal 72 is connected to a potential P2 when the switch is closed. The switch 74 is, for example, an emergency-off switch for a machine, or a protective guard.

Depending on the desired safety category, the two potentials P1 and P2 are the same (category 3) or different (category 4). The latter can also be achieved by the potentials P1 and P2 being clocked differently.

The safety switching device 50 also has output terminals 76, 78, with each output terminal being connected to the output 66 of a respective switching element 56, 58. Each output terminal is thus associated with a switching element, wherein the output signal from the switching element can be tapped off externally via the appropriate output terminal.

An actuator 80, for example a relay or a contactor, is connected to each of the output terminals 76, 78. The make contacts 82 of the two relays 80 are connected in series, and are used for closing or opening a power supply line to a machine 84, which is indicated only schematically. In the present exemplary embodiment, the machine 84 runs only when both make contacts 82 are closed, that is to say when a signal which is sufficient to activate the relay 80 is produced at both output terminals 76, 78.

The safety switching device 50 has a further input terminal 86, to which a start signal can be supplied. This start signal is produced by a start switch 88 by producing a connection to a potential P1. Two further make contacts 90 of the relay 80 are connected in series with the start switch 88 and are positively linked to the make contacts 82 but, in contrast to them, are in the form of break contacts. This means that the input terminal 86 is always disconnected from the potential P1 when at least one of the two make contacts 82 is closed.

The job of the safety switching device 50 is to close the make contacts 82 when a start signal is applied to the input terminal 86. The machine 84 then starts. If the emergency-off switch 74 is pressed when an emergency occurs, the evaluation and control unit 52 evaluates this switching event and drives the switching elements 56, 58 appropriately. The output signals are changed to the second potential (ground), so that the current flow through the two relays 80 is interrupted. This leads to the two make contacts 82 opening, and to the machine 84 coming to rest. The evaluation and control unit 52 in this case operates in a fail-safe manner in the sense of European Safety Standards, so that, for example, welded make contacts in the relays 80 or a cross-connection between the two input terminals 70, 72 are or is identified. Furthermore, the feedback signal allows a fault in the switching element 56, 58 to be identified.

Figure 3:
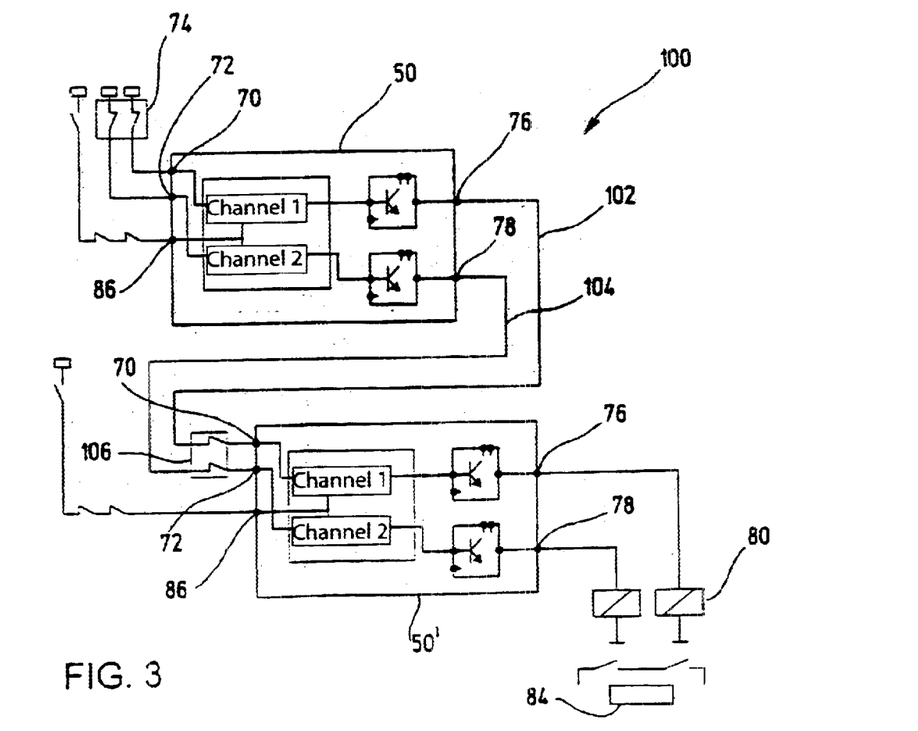
FIG. 3 shows a schematic illustration of two safety switching devices, as shown in FIG. 2, connected in series.

FIG. 3 illustrates a system 100 of safety switching devices, which system comprises two safety switching devices 52, 52'.

The two safety switching devices 50, 50' are connected to one another via two lines 102, 104, with the two lines 102, 140 being connected at one end to the output terminals 76, 78 of the safety switching device 50, and at their other end to the input terminals 70, 72 of the safety switching device 50'. A two-channel switch 106, for example an emergency-off switch, is arranged in the lines 102, 104 and, when operated, interrupts the electrical connection between the safety switching devices 50, 50'.

The input terminals 70, 72, 86 of the first safety switching device 50 are connected as shown in FIG. 2. Furthermore, the input terminals 86 of the safety switching device 50' are connected as shown in FIG. 2. The relays 80 are connected to the output terminals 76, 78 of the second safety switching device 50', in order to control the machine 84.

The two safety switching devices 50, 50' are thus linked to one another such that operation of one of the two switches 74, 106 is sufficient to open the make contacts 82 of the relays 80, and to bring the machine 84 to rest.

Since the two input terminals 70, 72 of the second safety switching device 50' are at the same potential, it is not possible here to reliably identify a cross-connection between the two lines 102, 104, so that this system satisfies safety category 3 only.

Figure 4:
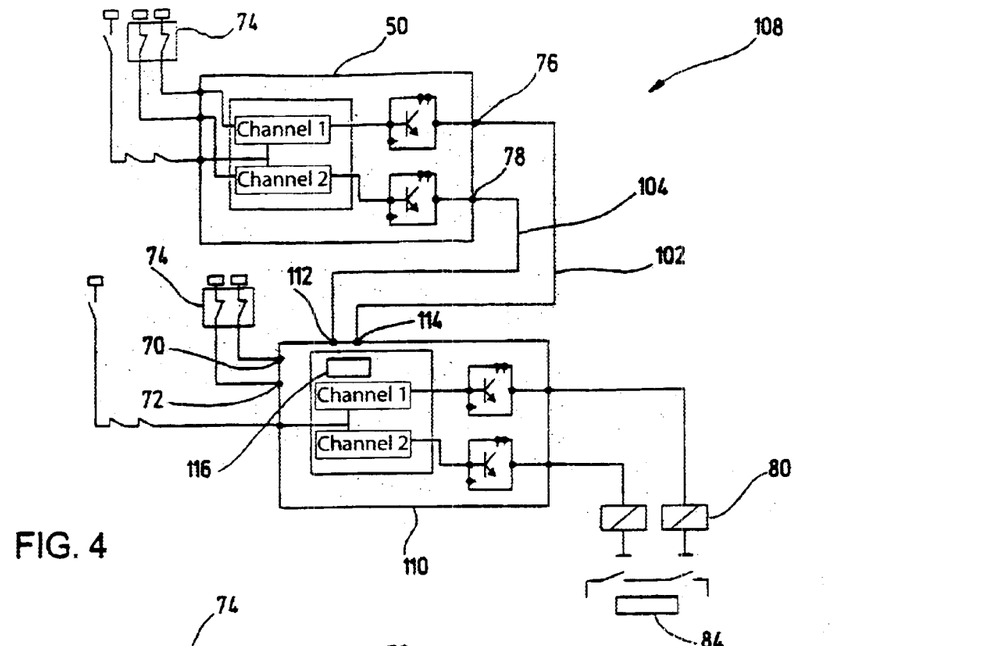
FIG. 4 shows a schematic illustration of a safety switching device as shown in FIG. 2 and a further safety switching device according to a further exemplary embodiment connected in series.

In order to achieve safety category 4, FIG. 4 illustrates a further exemplary embodiment of a system 108 of safety switching devices. The design of this system 108 of safety switching devices corresponds essentially to that of the safety switching device system 100 that has been explained with reference to FIG. 3. The difference is the design of the second safety switching device 110. In addition to the two in put terminals 70, 72, this also has two further input terminals 112, 114, which are used as dedicated inputs. The input terminals 112, 114 are connected via lines 102, 104 to the output terminals 76, 78 of the first safety switching device 50.

The two input terminals 70, 72 of the second safety switching device 110 are connected to a switch 74, which allows a connection to potentials P1 and P2. If the two potentials P1, P2 are chosen to be different, it is possible to identify a cross-connection between the two input terminals 70, 72. A cross-connection between the two lines 102, 104 can be detected via the feedback signals from the switching elements 56, 58 in the first safety switching device 50. Safety category 4 is thus achieved.

In order to achieve the same function as the system 100 of safety switching devices, the evaluation and control unit 52 in the safety switching device 110 has a logic interconnection unit 116. The logic interconnection unit 116 is supplied with the signals which are applied to the additional input terminals 112, 114. The function of the logic interconnection unit 116 is to disconnect the current flow of the relays 80 via the switching elements 56, 58 even when the switch 74 associated with the first safety switching device 50 is operated. A possible implementation of this function is AND-interconnected the signals applied to the input terminals 70 and 112 and to the input terminals 72 and 114 in order to form a combined switching signal, with the two resultant combined switching signals then being processed in the same way as the input signals which are applied to the input terminals 70, 72 in the safety switching device 50. The logic interconnection unit 116 interconnects the signals at the respective input terminals 17 and 112 as well as at 72 and 114 to one another even before any signal is produced at the output of the safety switching device.

In principle, the logic operation can be carried out in a manner known per se by means of a digital "hard-wired" logic circuit. If the evaluation and control unit 52 is in electronic form, the logic operation is preferably implemented by means of a microprocessor and suitable manufacturer programming, or by means of an appropriate ASIC. In further exemplary embodiments, alternative logic operations are possible, for example an AND operation and, alternatively, an OR operation. The desired type of logic operation can be transmitted via an interface (V24, USB, infrared or the like) to an internal memory in the safety switching device. In a further exemplary embodiment, the desired logic operation can be determined using an interchangeable smart card.

In the case of an OR logic operation, an additional identification is preferably produced and provided at one output, which identification can be used to allow a machine to be controlled to rotate at a limited speed only.

Figure 5:
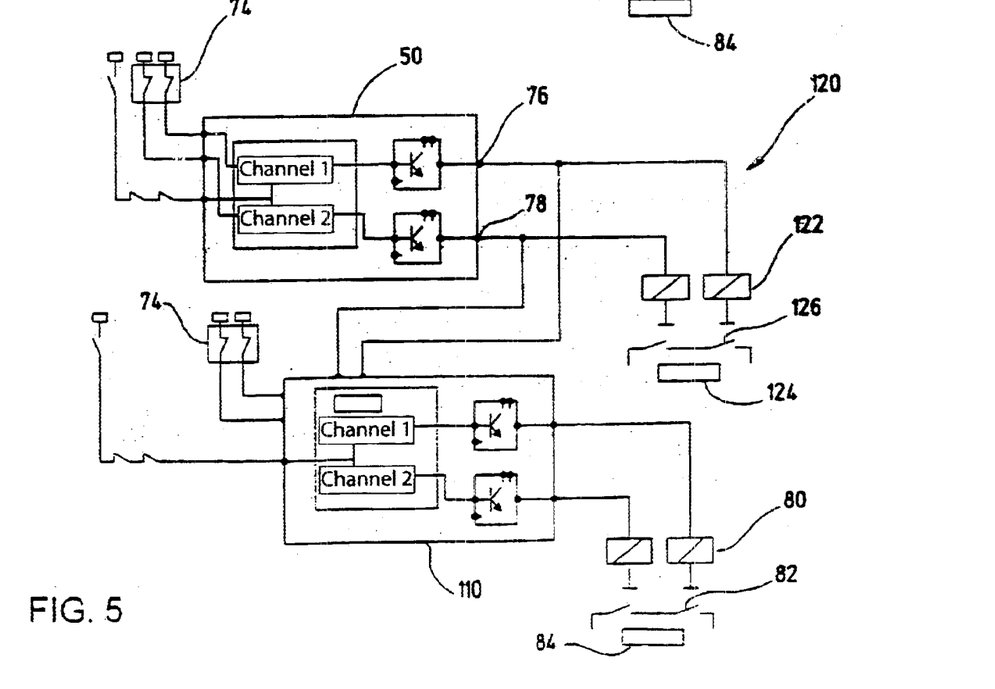
FIG. 5 shows the system of safety switching devices illustrated in FIG. 4, with a further actuator.

FIG. 5 shows a further exemplary embodiment of a safety switching device system, which is identified by reference symbol 120. The system 120 of safety switching devices corresponds essentially to that in FIG. 4. For this reason, those parts which are identified by the same reference symbols will not be explained in detail.

The difference from the system 108 of safety switching devices as shown in FIG. 4 is that two further relays 122, more generally two further actuators, are provided, which can connect and disconnect the power supply to a machine or to a machine section 124. Each of the two relays 122 has make contacts 126. One of the relays 122 is connected to the output terminal 76, and the other one is connected to the output terminal 78 of the first switching device 50. The make contacts 126 are thus operated as a function of the signals which are produced at the output terminals 76, 78 of the first safety switching device 50.

Overall, this results in a hierarchical system of safety switching devices, which system disconnects one or more relays 80, 122 depending on the position of a single safety switching device within the series circuit. By way of example, the relays 80 switch the valves (not shown here) and the relays 122 switch the pumps (likewise not shown) of a hydraulic press.

In the present exemplary embodiment, the operation of the switch 74 which is associated with the first safety switching device 50 leads to opening of both the make contacts 126 of the relays 122 and of the make contacts 82 of the relays 80. Both machine sections (valves and pumps) 84, 124 are thus brought to rest. If, however, the switch 74 associated with the second safety switching device 110 is operated, this leads only to opening of the make contacts 82, and thus to the machine section 84 (valves) coming to rest. The machine section 124 (pumps) is not affected by this switching event.

In general, the operation of this hierarchical safety switching device system 120 can be described by stating that the operation of a switch actually influences the downstream safety switching devices only, but not those upstream.

Figure 6:
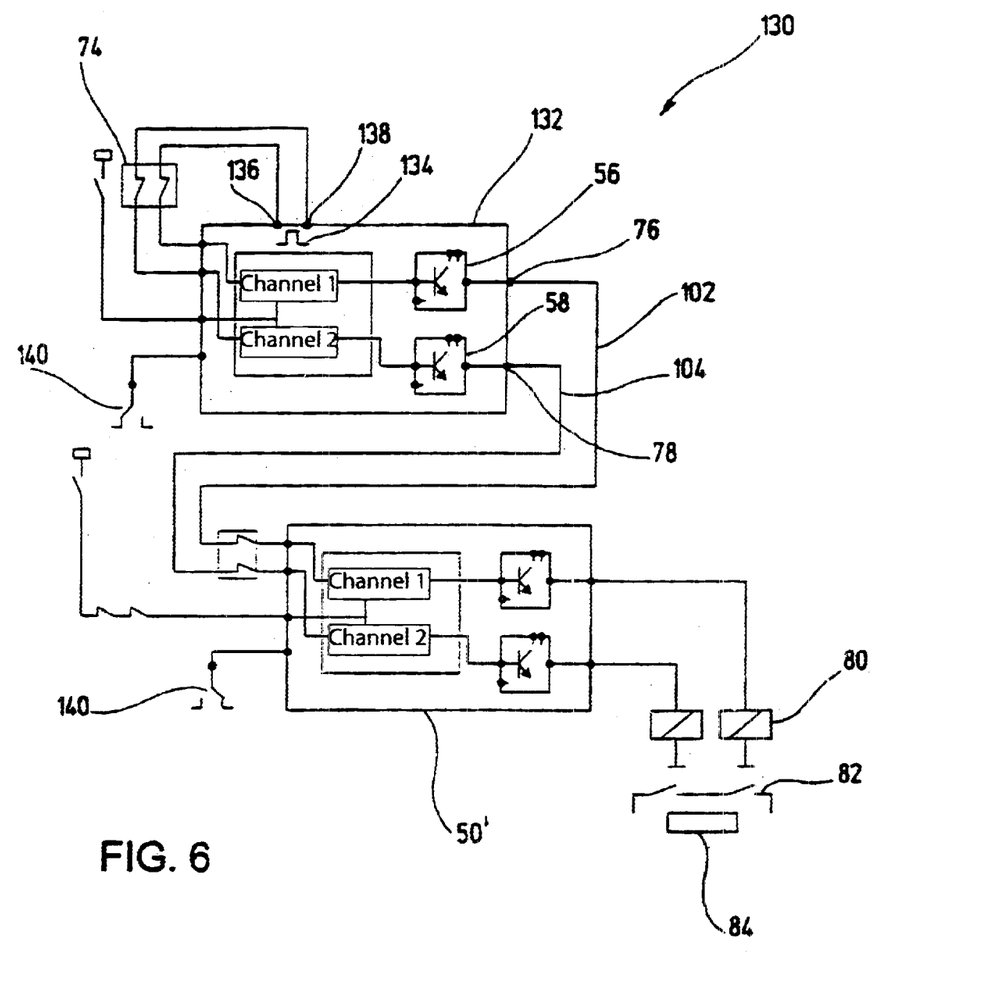
FIG. 6 shows a schematic illustration of two safety switching devices according to a further exemplary embodiment connected in series.

FIG. 6 shows a further exemplary embodiment of a system of safety switching devices, which system is identified by reference symbol 130. The safety switching device system 130 corresponds essentially to the safety switching device system 100 illustrated in FIG. 3. For this reason, parts which are identified by the same reference symbols will not be described once again.

The difference from the system 100 of safety switching devices is the configuration of the safety switching device 132. As already mentioned above, the switch 74 in the first safety switching device 132 has two different potentials P1 and P2 applied to it, in order to achieve safety category 4. However, instead of applying two different potentials to it, it is also possible to apply two different clock signals, for example phase-shifted clock signals, to the switch 74, with these clock signals being fed back to the input terminals 70, 72 when the switch 74 is closed. The two different clock signals are produced by a clock generator 134 in the safety switching device 132, and are provided at two further output terminals 136, 138. From here, they are passed via electrical connections to the switch 74. The evaluation and control unit 52 now detects these two clock signals via the input terminals 70, 72, and compares them with the original signals produced at the output terminals 136, 138. If any discrepancies are detected, this indicates either that the switch 74 has been operated or that there is a fault in the signal lines. The evaluation and control unit 52 will then drive the switching elements 56, 58 appropriately, so that the make contacts 82 of the relays 80 are opened via the second safety switching device 50', and the machine 84 comes to rest.

In order to identify faults in the two lines 102, 104 between the two safety switching devices 132, 50' as well, a clock signal is likewise applied to these lines. The switching elements 56, 58 in the first safety switching device 132 are thus operated in a clock mode, so that a corresponding clock signal is produced at the output terminals 76, 78.

Since a clock signal such as this is not suitable for driving a relay 80, the safety switching device 132 or 50' can be switched, via a switch 140, between a first operating mode (normal mode) and a second operating mode (clock mode). In the normal mode, a signal which is suitable for driving a relay is produced at the output terminals 76, 78 while, in the clock mode, clock signals which can be processed by a downstream safety switching device are produced at the output terminals 76, 78.

In the present exemplary embodiment, the safety switching device 132 is operated in the clock mode, and the safety switching device 50' is operated in the normal mode, since the latter is intended for driving the relays 80.

Different exemplary embodiments of a system of safety switching devices have been described with reference to FIGS. 3 to 6, with the individual systems having only two safety switching devices, for reasons of clarity. It goes without saying that the number of series-connected safety switching devices may be chosen to be greater, if appropriate. The switching delay time of the overall system is the only limiting factor on the number which may be chosen. Due to the very short switching delay time of the switching elements 56, 58 used, this limit is considerably greater than in the case of a system as is shown in FIG. 1.

Figure 7:
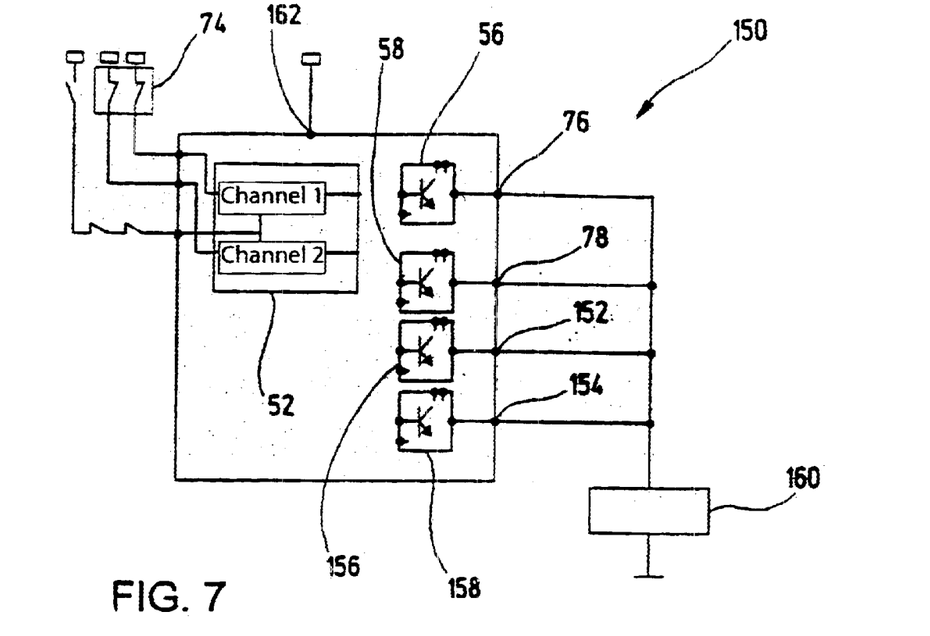
FIG. 7 shows a schematic illustration of a safety switching device according to a further exemplary embodiment.

FIG. 7 shows a further exemplary embodiment of a safety switching device, which is identified by reference symbol 150. The safety switching device 150 essentially corresponds to the safety switching device 50 illustrated in FIG. 2, so that parts which are identified by the same reference symbols will not be described. In contrast to the safety switching device 50 shown in FIG. 2, the safety switching device 150 has further output terminals 152, 154, moreover, which are provided in addition to the output terminals 76, 78. Each of the output terminals 76, 78, 152, 154 is connected to the output of a switching element 56, 58, 156, 158, and these switching elements each receive their control signal from the evaluation and control unit 52.

The signals which are produced at the output terminals 76, 78, 152, 154 are joined together and are used for supplying, for example, a PLC board 160. Joining the signals together allows the current level to be increased.

In order to avoid the joining of the outputs being identified as a short circuit by the evaluation and control unit 52 via the evaluation of the feedback signals, this evaluation in the safety switching device 150 can be disabled by applying a defined signal to a control input terminal 162.

Figure 8:
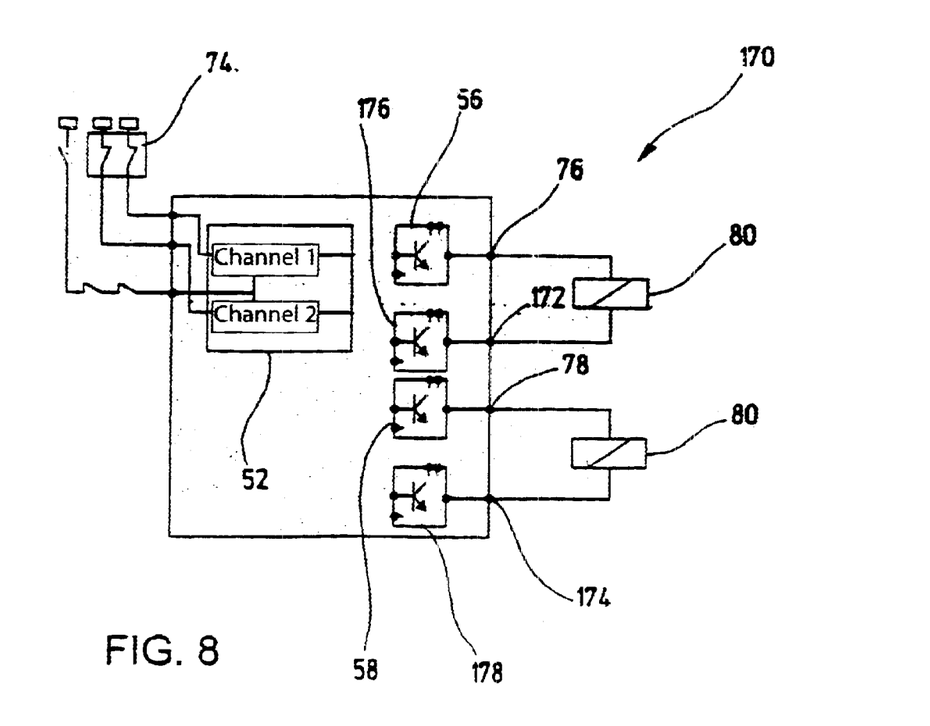
FIG. 8 shows a schematic illustration of a safety switching device according to a further exemplary embodiment.

FIG. 8 shows another exemplary embodiment of a safety switching device, which is identified by reference symbol 170. The safety switching device 170 corresponds essentially to the safety switching device 50 which is described with reference to FIG. 2. The difference is that the outputs are designed to have two poles. This means that an associated complementary output terminal 172 and 174, respectively, is provided for each output terminal 76, 78. The two complementary output terminals 172, 174, respectively, have a respectively associated complementary switching element 176, 178. In order to cause a current to flow through the relay 80 which is connected to the output terminal pair 76, 172 or 78, 174, respectively, the respective switching element pairs 56, 176 and 58, 176 are designed to be complementary to one another. When the two switching elements 56, 176 or 58, 178, respectively, are switched on, the respective output terminals 76 and 78 are changed to a first potential, and the respective output terminals 172 and 174 are changed to a second potential, with these two potentials being different.

This two-pole configuration has the advantage that additional disconnection paths are available for relays 80, so that the fail-safety of the safety switching device 170 is improved.

It goes without saying that the safety switching device 170 can also be used in the safety switching device systems described above.

What is claimed is:

1. A system of safety switching devices comprising:
an upstream safety switching device and a downstream safety switching device,
said upstream safety switching device comprising at least a first and a second electronic switching element, at least a first and a second output terminal, and at least a first input terminal for receiving a first switching signal which acts on both the first and the second switching elements, wherein the first and second switching elements each have an output that, depending on the first switching signal, provides an output signal having either a first potential or a second potential, and wherein the output of the first switching element is connected to the first output terminal, and the output of the second switching element is connected to the second output terminal, said downstream safety switching device comprising at least a third and a fourth electronic switching element, at least a third and a fourth output terminal, and at least a third and a fourth input terminal for receiving a third and a fourth switching signal acting on both the third and the fourth switching elements, wherein the third and the fourth switching elements each have an output that, depending on the third and the fourth switching signal, provides an output signal having either a third potential or a fourth potential, and wherein the output of the third switching element is connected to the third output terminal, and the output of the fourth switching element is connected to the fourth output terminal, wherein said upstream safety switching device and said downstream safety switching device are connected in series such that said first and second output terminals of said upstream safety switching device are connected to said third and fourth input terminals of said downstream safety switching device, the system further comprising at least one switching source being serially arranged in the connection between said first and second output terminals and said third and fourth input terminals.

2. The system of claim 1, further comprising at least one actuator being coupled to the connection between said first and second output terminals and said third and fourth input terminals.

3. A system of safety switching devices comprising:

an upstream safety switching device and a downstream safety switching device, said upstream safety switching device comprising at least a first and a second electronic switching element, at least a first and a second output terminal, and at least a first input terminal for receiving a first switching signal which acts on both the first and the second switching elements, wherein the first and second switching elements each have an output that, depending on the first switching signal, provides an output signal having either a first potential or a second potential, and wherein the output of the first switching element is connected to the first output terminal, and the output of the second switching element is connected to the second output terminal, said downstream safety switching device comprising at least a third and a fourth electronic switching element, at least a third and a fourth output terminal, and at least a third and a fourth input terminal for receiving a third and a fourth switching signal acting on both the third and the fourth switching elements, wherein the third and the fourth switching elements each have an output that, depending on the third and the fourth switching signal, provides an output signal having either a third potential or a fourth potential, and wherein the output of the third switching element is connected to the third output terminal, and the output of the fourth switching element is connected to the fourth output terminal, wherein said upstream safety switching device and said downstream safety switching device are connected in series such that said first and second output terminals of said upstream safety switching device are connected to said third and fourth input terminals of said downstream safety switching device, with said downstream safety switching device further comprising at least one further input terminal for receiving a second switching signal and a logic interconnection unit, with said logic interconnection unit logically interconnecting said at least one second switching signal and said third and fourth switching signals received from said upstream safety switching device to form combined switching signals acting on said third and fourth switching elements, wherein operation of the second switching signal results in a corresponding switching event in the downstream safety switching device but not in the upstream safety switching device.

4. The system of claim 3, further comprising at least one actuator being coupled to the connection between said first and second output terminals and said third and fourth input terminals.

5. A system of safety switching devices comprising:

a first switching source for providing a first switching signal, an upstream safety switching device having a first input terminal for receiving said first switching signal, and further having at least a first and a second electronic switching element for providing a first and a second output signal as a function of said first switching signal, a downstream safety switching device having at least one second input terminal, and a third and a fourth electronic switching element for providing a third and a fourth output signal, wherein said first and second output signals and said third and fourth output signals each have either a first potential or a second potential, and wherein said upstream and downstream safety switching devices are connected in series such that said first and second output signals are coupled to said at least one second input terminal, the system further comprising a second switching source for providing a second switching signal, said downstream safety switching device providing said third and fourth output signals as a function of both the first and second output signals and the second switching signal, wherein operation of the second switching source influences the downstream safety switching device only, but not the upstream safety switching device.

6. The system of claim 5, further comprising lines for connecting the upstream and downstream safety switching devices, wherein the second switching source is a switch being arranged in the lines and interrupting, when operated, the electrical connection between the upstream and downstream safety switching devices.

7. The system of claim 5, wherein the downstream safety switching device further comprises two further input terminals which are connected to the second switching source.

8. The system of claim 7, wherein the downstream safety switching device further comprises a logic interconnection unit logically interconnecting the first and second output signals and the second switching signal to form a combined switching signal.

9. The system of claim 8, wherein said logic interconnection unit logically AND-interconnects said first and second output signals and the second switching signal.

10. The system of claim 5, further comprising lines for connecting the upstream and downstream safety switching devices and at least one actuator being coupled to the lines.

11. The system of claim 5, wherein at least the upstream safety switching device comprises a mode selector for selecting at least a first or a second operating mode, with said first and second switching elements both providing steady-state output signals in the first operating mode, and both providing pulsed output signals in the second operating mode.

12. The system of claim 5, with at least the upstream safety switching device further comprising a fifth and a sixth output terminal as well as a clock generator, said clock generator providing two different clock signals at said fifth and sixth output terminals.

13. The safety switching device of claim 5, with at least the upstream safety switching device further comprising a first and a second complementary output terminal, and a first and a second complementary switching element having a first and a second complementary output, wherein said first and second complementary outputs are respectively connected to said first and second complementary output terminals.

* * * * *